US010559352B2

(12) United States Patent
Shankar et al.

(10) Patent No.: US 10,559,352 B2
(45) Date of Patent: Feb. 11, 2020

(54) BITLINE-DRIVEN SENSE AMPLIFIER CLOCKING SCHEME

(71) Applicant: QUALCOMM Incorporated, San Diego, CA (US)

(72) Inventors: Harish Shankar, Cary, NC (US); Manish Garg, Cary, NC (US); Rahul Krishnakumar Nadkarni, Cary, NC (US); Rajesh Kumar, San Diego, CA (US); Michael Phan, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/134,937

(22) Filed: Sep. 18, 2018

(65) Prior Publication Data
US 2019/0214076 A1 Jul. 11, 2019

Related U.S. Application Data

(60) Provisional application No. 62/614,322, filed on Jan. 5, 2018.

(51) Int. Cl.
*G11C 11/00* (2006.01)
*G11C 11/419* (2006.01)
*G11C 7/08* (2006.01)
*G11C 8/18* (2006.01)
*G11C 7/10* (2006.01)
*G11C 11/418* (2006.01)

(52) U.S. Cl.
CPC .............. *G11C 11/419* (2013.01); *G11C 7/08* (2013.01); *G11C 7/1042* (2013.01); *G11C 8/18* (2013.01); *G11C 11/418* (2013.01)

(58) Field of Classification Search
CPC ........................... G11C 11/419; G11C 11/418
See application file for complete search history.

(56) References Cited

U.S. PATENT DOCUMENTS

| 7,406,643 | B2  | 7/2008  | Osada et al. |
| 7,746,716 | B2  | 6/2010  | Jetton et al. |
| 9,384,790 | B2  | 7/2016  | Trivedi et al. |
| 9,520,165 | B1* | 12/2016 | Desai ........................ G11C 7/12 |
| 9,640,231 | B1  | 5/2017  | Ahmed et al. |
| 9,659,604 | B1* | 5/2017  | Raghavan ................ G11C 5/06 |

(Continued)

OTHER PUBLICATIONS

International Search Report and Written Opinion—PCT/US2018/057520—ISA/EPO—Jan. 24, 2019.

*Primary Examiner* — Pho M Luu
(74) *Attorney, Agent, or Firm* — Muncy, Geissler, Olds & Lowe, P.C./Qualcomm

(57) ABSTRACT

A memory system includes a sense amplifier electrically coupled to a first bitline and a second bitline associated with a column of a memory array, a bl transistor electrically coupled to the first bitline, wherein the bl transistor is configured to receive as input a first electrical signal from the first bitline, and a blb transistor electrically coupled to the second bitline, wherein the blb transistor is configured to receive as input a second electrical signal from the second bitline, wherein an output of the bl transistor and an output of the blb transistor are electrically coupled together as a common output, and wherein the sense amplifier is configured to receive as an input the common output of the bl transistor and the blb transistor.

28 Claims, 10 Drawing Sheets

(56) References Cited

U.S. PATENT DOCUMENTS

| | | | |
|---|---|---|---|
| 10,163,490 B2 * | 12/2018 | Nguyen | G11C 11/419 |
| 2011/0298496 A1 * | 12/2011 | Rennie | G11C 7/065 |
| | | | 327/52 |
| 2013/0083615 A1 | 4/2013 | Choi | |
| 2014/0003160 A1 | 1/2014 | Trivedi et al. | |
| 2017/0345486 A1 | 11/2017 | Chang et al. | |
| 2018/0012649 A1 | 1/2018 | Ghosh et al. | |

* cited by examiner

BITLINE-DRIVEN SENSE AMPLIFIER CLOCKING SCHEME

CROSS-REFERENCE TO RELATED APPLICATIONS

The present Application for Patent claims the benefit of U.S. Provisional Application No. 62/614,322, entitled "BITLINE-DRIVEN SENSE AMPLIFIER CLOCKING SCHEME," filed Jan. 5, 2018, assigned to the assignee hereof, and expressly incorporated herein by reference in its entirety.

INTRODUCTION

Aspects of this disclosure relate generally to sense amplifiers in a memory chip, and more particularly to sense amplifier clocking schemes and the like.

In computer memory, a sense amplifier is part of the read circuitry of a semiconductor memory chip that is used when data is read from the memory. The data in a semiconductor memory chip is stored in memory cells, which are laid out on the chip in an array of rows and columns. Conductive lines connecting the memory cells of a row are referred to as "wordlines" and are activated by generating a voltage on them. Each column of memory cells has an associated pair of conductive lines, one on either side of the column of memory cells, referred to as "bitlines." Each pair of bitlines is attached to a sense amplifier at the edge of the memory array. Each memory cell lies at the intersection of a particular wordline and bitline, the intersection of which can be used to "address" the cell.

To read a bit from a particular memory cell in a static random-access memory (SRAM) chip, the wordline (row) in which the cell is located is activated (i.e., a current is generated on the wordline). The value (logic "0" or "1") stored in the cell can then be determined by sensing the voltage differential across the pair of bitlines associated with the memory cell (i.e., the bitlines on either side of the column of memory cells containing the involved memory cell). The role of the sense amplifier associated with the bitline pair is to sense the voltage differential across the bitlines, which represents the value stored in the memory cell, and to amplify that voltage differential to a recognizable logic level (i.e., logic "0" or "1") so that the data can be properly interpreted by logic outside of the memory array. The bit from the desired memory cell is then latched from the cell's sense amplifier into a buffer, and put on the output bus.

The operation of a sense amplifier in a dynamic random-access memory (DRAM) chip is similar to the operation of a sense amplifier in an SRAM chip, with an additional function. The data in each memory cell of a DRAM chip is stored as an electric charge in a capacitor in the memory cell. A read operation of a particular memory cell depletes the charge in the cell, destroying the data. As such, after the data is read out, the sense amplifier immediately writes it back into the cell by applying a voltage to the cell, thereby recharging the capacitor. This is referred to as a memory refresh.

A sense amplifier is driven by a sense amplifier enable ("saen") signal that is generated by a sense amplifier enable signal generator. To enable a sense amplifier to sense the voltage level across a pair of bitlines, the sense amplifier enable signal generator receives an external clock signal and generates the sense amplifier enable signal after a delay of some period of time. Upon receiving the sense amplifier enable signal, the sense amplifier can detect the voltage differential across the pair of bitlines.

Memory cells in SRAM circuits generally consist of two, four, or six transistors. In six-transistor (6T) SRAM based designs, the "race" between the time a sense amplifier receives the sense amplifier enable signal and the time during which it can accurately evaluate the voltage across the bitline (i.e., determine whether the memory cell being read contains a "0" or "1") is an important performance margin. The sense amplifier enable signal needs to arrive such that the bitline differential (i.e., the voltage across the pair of bitlines) is sufficient to meet the sense amplifier offset (i.e., the minimum voltage difference required on the bitline for the sense amplifier to properly detect the difference in the voltage). In addition, the timing of the sense amplifier enable signal directly affects the delay of the SRAM output, with a longer delay in generating the sense amplifier enable signal causing a longer delay in reading the memory cell.

Further, the sense amplifier enable signal needs to track with the six-sigma statistical weak bit evaluation (in any Integrated circuit, the transistors have some differences in current strengths due to manufacturing defects—thus, most SRAM circuits are designed to have a sufficient margin to cover six times the variance, or "sigma," of the process). In memories that have complex decoding, such as content addressable memory (CAM)-based decoding or prediction based decoding, the divergence path between the bitline pair voltage differential and the arrival of the sense amplifier enable signal can be large, and hence, the on-chip variation (OCV) margin may also be large. This divergence adds to the output delay of the SRAM array.

Typically, the "rd_bank_clk" (i.e., the clock within a bank array of a memory chip) acts as the point of divergence for this race margin, as the sense amplifier enable signal generator receives a clock signal from the rd_bank_clk. However, in memories requiring word/byte gating of a wordline, there are multiple paths that may determine the point of divergence, and hence, the primary clock ("clk") may also cause a delay. Also, a dual voltage domain requires this margin to pass across a wide range of both array and logic domain voltages. More specifically, low power memories use a dual voltage domain architecture. In this architecture, the memory bit-cell array is connected to a supply with limited scalability (the array supply domain), whereas parts of the periphery and the rest of the logic are connected to a different, fully scalable power supply (the logic supply domain). During low power operation, the logic supply is lowered to a much lower voltage than the minimum voltage at which the bit-cell can operate. Under such an architecture, the wordline and sense amplifier paths span over the two voltage domains and need to track with each other across the full range of the individual supply.

In addition, the worst case sense margin occurs at the low voltage level, which drives the turbo corner (i.e., a high voltage corner that sets the highest supported frequency) sense amplifier enable signal timing. More specifically, the increased variation at low voltages requires a larger margin at low voltage corners and affects the timing of the sense amplifier enable signal at turbo corners. Reducing the divergence between the bitline and the sense amplifier enable signal can help save on the OCV margin and improve the overall timing of the macro (e.g., SRAM block).

SUMMARY

The following presents a simplified summary relating to one or more aspects disclosed herein. As such, the following summary should not be considered an extensive overview relating to all contemplated aspects, nor should the following summary be regarded to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, a memory system includes a sense amplifier electrically coupled to a first bitline and a second bitline associated with a column of a memory array, a bl transistor electrically coupled to the first bitline, wherein the bl transistor is configured to receive as input a first electrical signal from the first bitline, and a blb transistor electrically coupled to the second bitline, wherein the blb transistor is configured to receive as input a second electrical signal from the second bitline, wherein an output of the bl transistor and an output of the blb transistor are electrically coupled together as a common output, and wherein the sense amplifier is configured to receive as an input the common output of the bl transistor and the blb transistor.

In an aspect, a method of operating a memory system includes receiving, at a bl transistor electrically coupled to a first bitline of a column of a memory array, a first electrical signal from the first bitline based on the first bitline being discharged, receiving, at a blb transistor electrically coupled to a second bitline of the column of the memory array, a second electrical signal from the second bitline based on the second bitline being discharged, wherein an output of the bl transistor and an output of the blb transistor are electrically coupled together as a common output, receiving, at a sense amplifier electrically coupled to the first bitline and the second bitline, the common output of the bl transistor and the blb transistor as a sense amplifier enable signal, and measuring, by the sense amplifier, a voltage differential across the first bitline and the second bitline based on reception of the sense amplifier enable signal.

In an aspect, a memory system includes first means for receiving a first electrical signal from a first bitline of a column of a memory array based on the first bitline being discharged, the first means for receiving electrically coupled to the first bitline, second means for receiving a second electrical signal from a second bitline of the column of the memory array based on the second bitline being discharged, the second means for receiving electrically coupled to the second bitline, wherein an output of the first means for receiving and an output of the second means for receiving are electrically coupled together as a common output, and means for amplifying a voltage swing configured to receive the common output of the first means for receiving and the second means for receiving as a sense amplifier enable signal, the means for amplifying the voltage swing electrically coupled to the first bitline and the second bitline, wherein the means for amplifying the voltage swing is further configured to measure a voltage differential across the first bitline and the second bitline based on reception of the sense amplifier enable signal.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

DETAILED DESCRIPTION

Disclosed is a memory system comprising a sense amplifier electrically coupled to a first bitline and a second bitline associated with a column of a memory array, a bl transistor electrically coupled to the first bitline, wherein the bl transistor is configured to receive as input a first electrical signal from the first bitline, and a blb transistor electrically coupled to the second bitline, wherein the blb transistor is configured to receive as input a second electrical signal from the second bitline, wherein an output of the bl transistor and an output of the blb transistor are electrically coupled together as a common output, and wherein the sense amplifier is configured to receive as an input the common output of the bl transistor and the blb transistor.

More specific aspects of the disclosure are provided in the following description and related drawings directed to various examples provided for illustration purposes. Alternate aspects may be devised without departing from the scope of the disclosure. Additionally, well-known aspects of the disclosure may not be described in detail or may be omitted so as not to obscure more relevant details.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, some aspects are described in terms of sequences of actions to be performed by, for example, elements of a computing device. It will be recognized that various actions described herein can be performed by specific circuits (e.g., Application Specific Integrated Circuits (ASICs)), by program instructions being executed by one or more processors, or by a combination of both. In addition, for each of the aspects described herein, the corresponding form of any such aspect may be implemented as, for example, "logic configured to" perform the described action.

Figure 1:
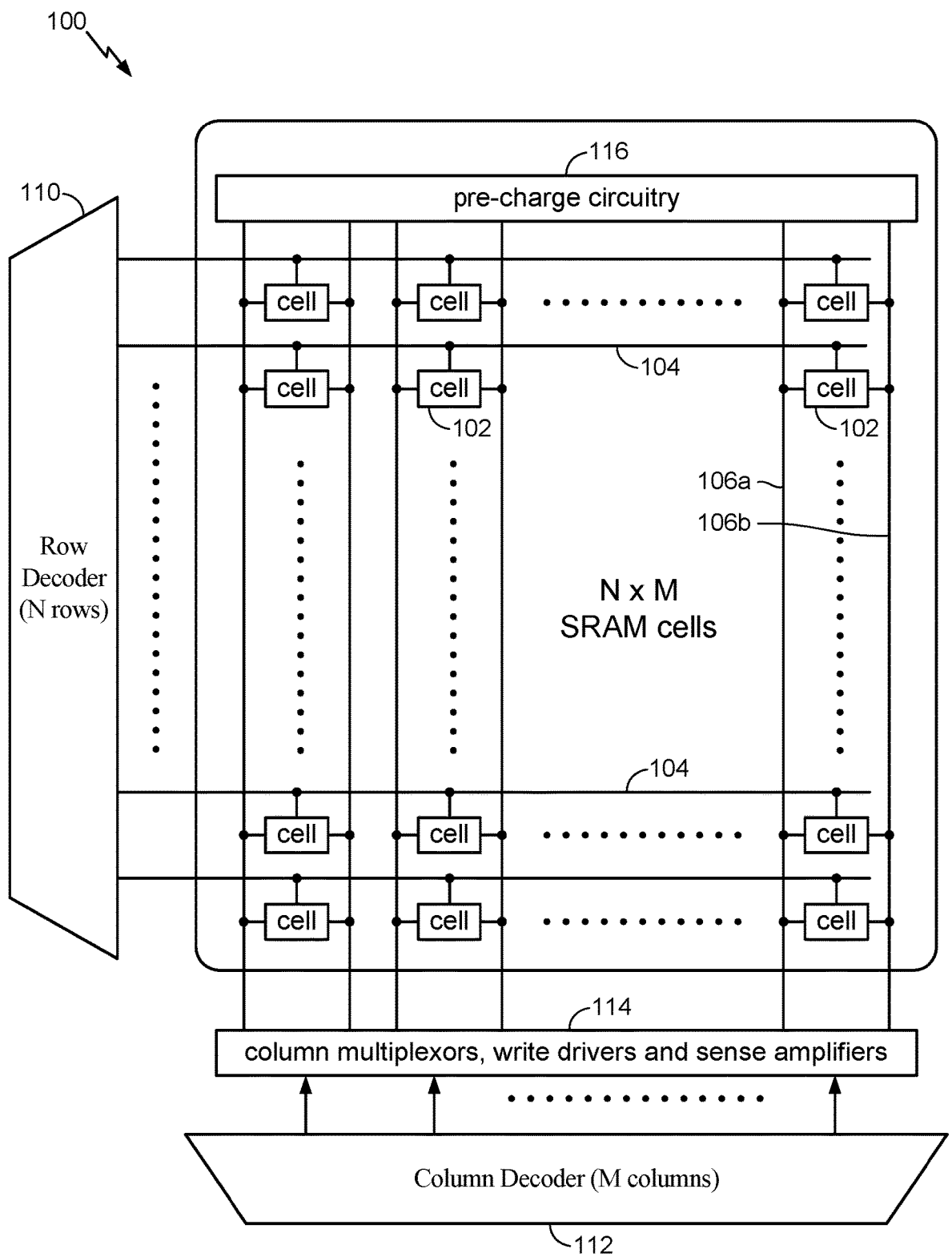
FIG. 1 illustrates an exemplary architecture of an SRAM.

FIG. 1 illustrates an exemplary architecture of an N×M SRAM array 100 having N rows and M columns, and therefore N×M memory cells (some of which are labeled with the reference number 102). Each memory cell 102 is connected to one of a plurality of wordlines (some of which are labeled with the reference number 104) and a pair of bitlines (some of which are labeled with the reference numbers 106a and 106b, and referred to collectively as bitlines 106 or individually as bitline 106) arranged perpendicularly to the wordlines 104. Only one wordline 104 is active at a time. A row decoder 110 receives and decodes address information in order to activate a single row by generating a current on the wordline 104 for that row. Similarly, a column decoder 112 also receives address information and activates the corresponding columns. The number of columns activated depends on the size of the word in the context of the system. For example, the system may have a 32 bit word, and in that case, the column decoder 112 would activate 32 columns at a time.

Sense amplifiers (not illustrated in FIG. 1) associated with the columns of the SRAM array 100 are used during a read operation to measure the voltage differential across pairs of bitlines 106 and to output full swing data that represents the value(s) of the data stored in the selected memory cell(s) 102. That is, a sense amplifier amplifies the small voltage "swing" (change) across a pairs of bitlines 106 and amplifies it to a recognizable logic level (i.e., "0" or "1"). Each column may be coupled to a sense amplifier, or multiple column multiplexors 114 can be used to multiplex the bitlines 106 of multiple columns to a single sense amplifier, thereby reducing the number of sense amplifiers required. The column decoder 112 can also send information to the write circuitry (not shown in FIG. 1), which is used to write data into selected memory cells 102 during a write operation. The SRAM array 100 also includes precharge circuitry 116 that will be described further below.

Figure 2:
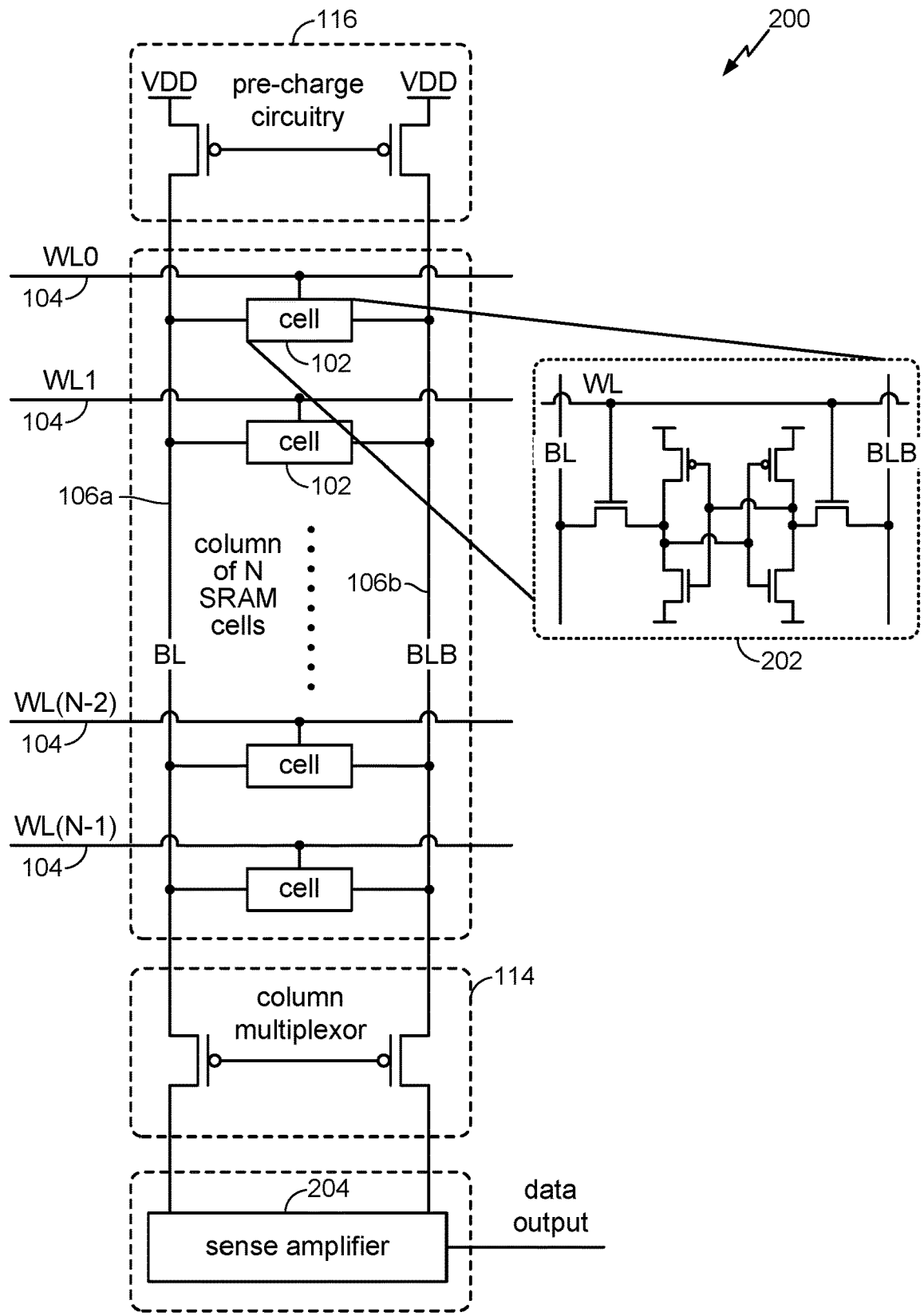
FIG. 2 illustrates an exemplary architecture of a single column of a SRAM array in more detail.

FIG. 2 illustrates an exemplary architecture of a single column 200 of the SRAM array 100 of FIG. 1 in more detail. The column 200 includes precharge circuitry 116, a plurality of memory cells 102, a plurality of wordlines 104, a pair of bitlines 106a and 106b (referred to individually as "bl" bitline 106a and "blb" bitline 106b, and collectively as bitlines 106), a column multiplexor 114, and a sense amplifier 204. When the SRAM array 100 is not active (i.e., there is no read or write operation), the precharge circuitry 116 is enabled, thus maintaining a high voltage on the bitlines 106. When a read operation is taking place, the precharge circuitry 116 is disabled and a single wordline 104 is enabled (i.e., a current is passed over the wordline 104). When the wordline 104 is enabled, a single memory cell 102 is able to change the voltage on the corresponding bitlines 106 ("bl" and "blb").

FIG. 2 illustrates a detailed view of the circuitry 202 of the most common type of memory cell 102 of an SRAM array 100, a 6T cell. The circuitry 202 comprises a latch where one side stores a high logical value, and the other side stores a low logical value. When the access transistors of the circuitry 202 are enabled by the current on the wordline 104, the circuitry 202 affects the bitlines 106 by discharging one of the bitlines 106, "bl" or "blb," depending on which side of the latch stores the low logical value.

A memory cell 102 of an SRAM array 100 is designed to be as small as possible in order for the largest number of memory cells 102, and therefore information, to be contained in a given area. As the memory cell 102 is small, its transistors are intrinsically weak. In addition, the bitlines 106 span the entire height of the column 200 and are connected to each memory cell 102 in the column 200. As such, the bitlines 106 have a high intrinsic parasitic capacitive load. The result of the weak memory cell 102 and the large capacitance of the bitlines 106 is that is can take a long time for a memory cell 102 to fully discharge. Moreover, once discharged, the bitline 106 needs to be re-charged by the precharge circuitry 116, which results in a non-trivial power dissipation. The purpose of the sense amplifier 204 is to detect a small differential signal on the bitlines 106 and amplify it in order to identify the data value stored in the selected memory cell 102.

The operation of a sense amplifier in a DRAM chip is similar to the operation of a sense amplifier in an SRAM chip, with an additional function. The data in each memory cell of a DRAM chip is stored as an electric charge in a capacitor in the memory cell. A read operation of a particular memory cell depletes the charge in the cell, destroying the data. As such, after the data is read out, the sense amplifier immediately writes it back into the cell by applying a voltage to the cell, thereby recharging the capacitor. This is referred to as a memory refresh.

A sense amplifier (e.g., sense amplifier 204) is driven by a sense amplifier enable ("saen") signal that is generated by a sense amplifier enable signal generator. To enable a sense amplifier to sense the voltage level across a pair of bitlines (e.g., bitlines 106a and 106b), the sense amplifier enable signal generator receives an external clock signal and generates the sense amplifier enable signal after a delay of some period of time. Upon receiving the sense amplifier enable signal, the sense amplifier can detect the voltage differential across the pair of bitlines.

Figure 3:
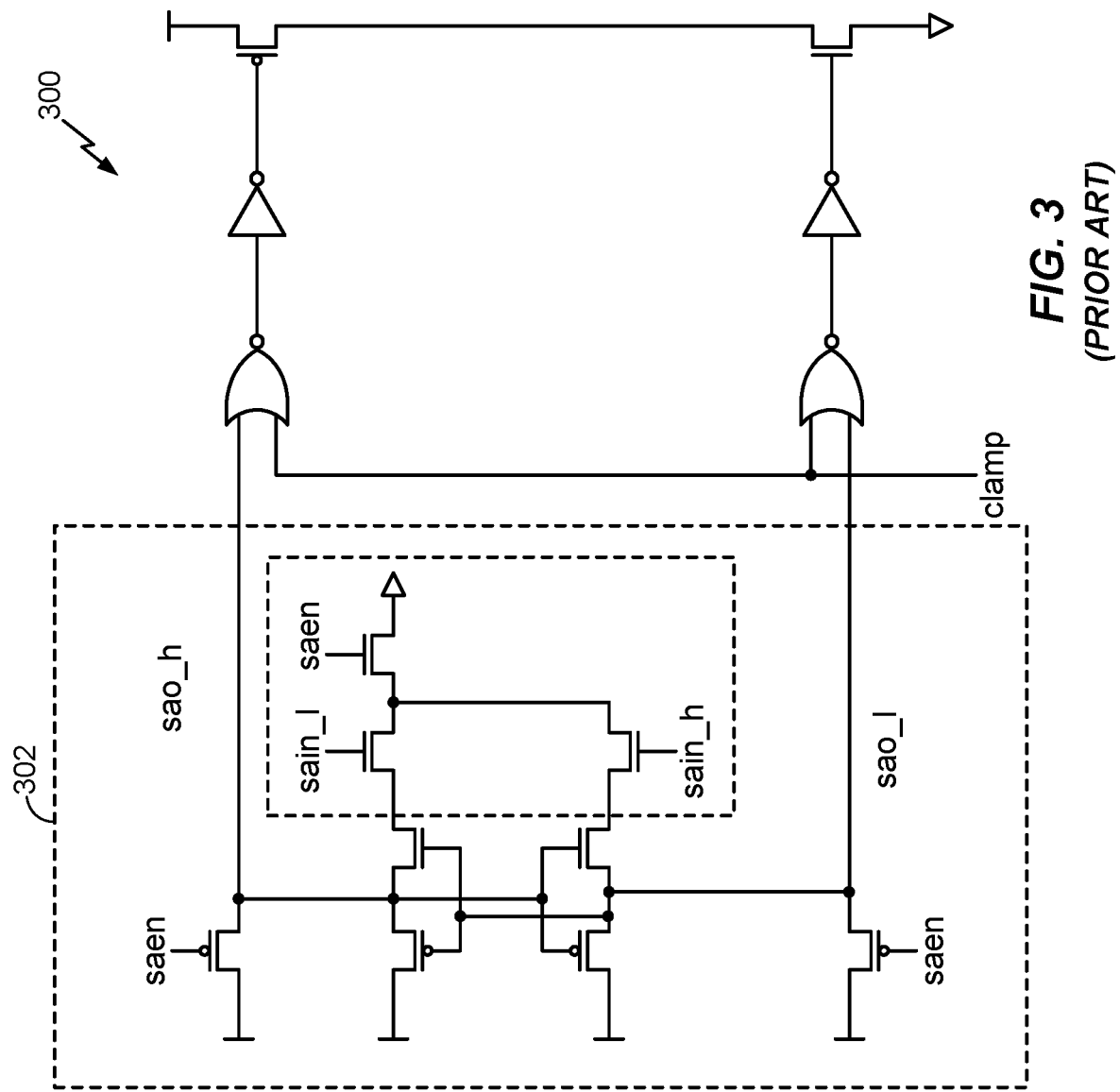
FIG. 3 illustrates an exemplary circuit including a conventional sense amplifier.

FIG. 3 illustrates a circuit 300 including a conventional sense amplifier 302. The sense amplifier 302 (which may be an example of the sense amplifier 204 in FIG. 2) has nine transistors, five n-channel field effect transistors (NFETs) and four p-channel field effect transistors (PFETs). Two NOR gates, an inverter, and two push-pull transistors are example logic gates that may be coupled to the sense amplifier 302. The two inputs "sain_h" and "sain_l" are the outputs of the column multiplexor (e.g., column multiplexor 114) feeding into the sense amplifier 302. The signals "sain_h" and "sain_l" represent the signals on the pair of bitlines selected by the column multiplexor. The "saen" input is the sense amplifier enable signal that activates the sense amplifier 302. In addition, the "saen" signal feeds two PFETs (illustrated at the top left side and the bottom left side of the sense amplifier 302) that feed the output signals "sao_h" and "sao_l."

When "saen" is LOW (i.e., a logical "0"), the PFETs drive a HIGH (i.e., a logical "1") value into the output signals "sao_h" and "sao_l." This operation is called precharging, and the two PFETs feeding the output signals "sao_h" and "sao_l" are referred to as precharge transistors. Similarly, where "sain_h" and "sain_l" start at a HIGH value, then during a read operation, "sain_l" will start to discharge and "sain_h" will remain HIGH. When "saen" goes HIGH, "sain_h" remains HIGH, which causes "sao_l" to be pulled LOW through the NFET stack 304. The cross coupled PFETS keep "sao_h" HIGH. A small discharge on the "sain_l" can be amplified by the sense amplifier into a full swing.

Figure 4:
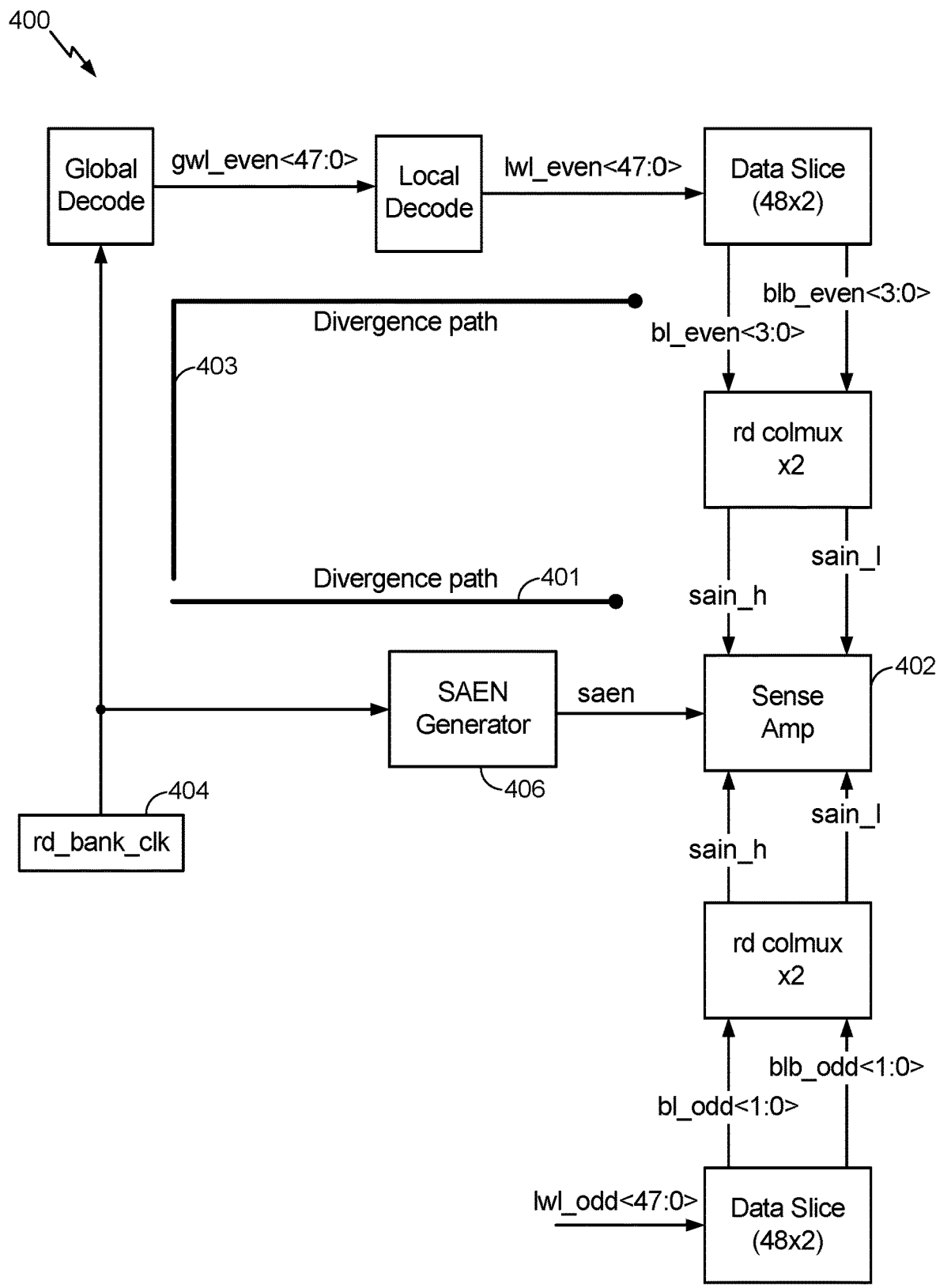
FIG. 4 illustrates a conventional system showing the generation of the sense amplifier enable signal.

FIG. 4 illustrates a conventional system 400 showing the divergence between the time a sense amplifier 402 receives a sense amplifier enable signal ("saen" in FIG. 4) and the time during which it can accurately evaluate the voltage across the bitline ("saen_h" and "saen_l"). As noted above, memory cells in SRAM arrays (e.g., memory cells 102) generally consist of two, four, or six transistors. In 6T SRAM based designs, the "race" between the time the sense amplifier 402 receives the sense amplifier enable signal "saen" and the time during which it can accurately evaluate the voltage differential across the bitline pair "saen_h" and "saen_l" (to determine whether the memory cell being read contains a logic "0" or "1") is an important performance margin. The sense amplifier enable signal "saen" needs to arrive at the sense amplifier 402 such that the bitline differential (i.e., the voltage across the pair of bitlines "saen_h" and "saen_l") is sufficient to meet the sense amplifier offset (i.e., the minimum voltage difference required on the bitline for the sense amplifier to properly detect the difference in the voltage). In addition, the timing of the sense amplifier enable signal saen directly affects the delay of the SRAM output, with a longer delay in generating the sense amplifier enable signal saen causing a longer delay in reading the memory cell.

Further, the sense amplifier enable signal saen needs to track with the six-sigma statistical weak bit evaluation. In macros that have complex decoding, such as CAM-based decoding or prediction based decoding, the divergence path between the bitline pair voltage differential and the arrival of the sense amplifier enable signal can be large, and hence, the OCV margin may also be large. This divergence adds to the output delay of the SRAM array.

Typically, the "rd_bank_clk" 404 (i.e., the clock within a bank array of a memory chip) acts as the point of divergence for this race margin, as the sense amplifier enable signal generator 406 receives a clock signal from the rd_bank_clk 404 (path 401), and the rd_bank_clk 404 also provides the voltage across the bitlines "saen_h" and "saen_l" (path 403). However, in macros requiring word/byte gating of a wordline, there may be multiple paths that determine the point of divergence, and hence, the primary clock ("clk") (not shown) may also cause a delay. Also, a dual voltage domain requires this margin to pass across a wide range of both array and logic domain voltages. More specifically, low power memories use a dual voltage domain architecture. In this architecture, the memory bit-cell array is connected to a supply with limited scalability (the array supply domain), whereas parts of the periphery and the rest of the logic are connected to a different, fully scalable power supply (the logic supply domain). During low power operation, the logic supply is lowered to a much lower voltage than the minimum voltage at which the bit-cell can operate. Under such an architecture, the wordline and sense amplifier paths span over the two voltage domains and need to track with each other across the full range of the individual supply.

In addition, the worst case sense margin occurs at the low voltage level, which drives the turbo (i.e., a high voltage corner that sets the highest supported frequency) corner sense amplifier enable signal timing. More specifically, the increased variation at low voltages requires a larger margin at low voltage corners and affects the timing of the sense amplifier enable signal at turbo corners. Reducing the divergence between the bitline evaluation and the sense amplifier enable signal can help save on the OCV margin and improve the overall timing of the macro.

One way to simplify the sense amplifier enable signal timing is to reduce the divergence between the evaluation of the bitline pair voltage differential and the generation of the corresponding sense amplifier enable signal. A subarray of 6T memory cells (e.g., memory cells 102) has bitline pairs that evaluate at different speeds. For example, a bitline that is discharged by a weak bit and with its column multiplexor ON is the slowest to evaluate. In contrast, a bitline that is discharged by a nominal bit with its column multiplexor OFF evaluates the fastest.

The proposed solution is to trigger the sense amplifier enable signal from the bitline evaluation. Specifically, a faster bitline evaluation triggers the sense amplifier enable signal to meet the margin for the slower bitline evaluations. Because the bitline discharge is used to generate the sense amplifier enable signal, the divergence path between the bitline evaluation and the generation of the sense amplifier enable signal is eliminated.

Figure 5:
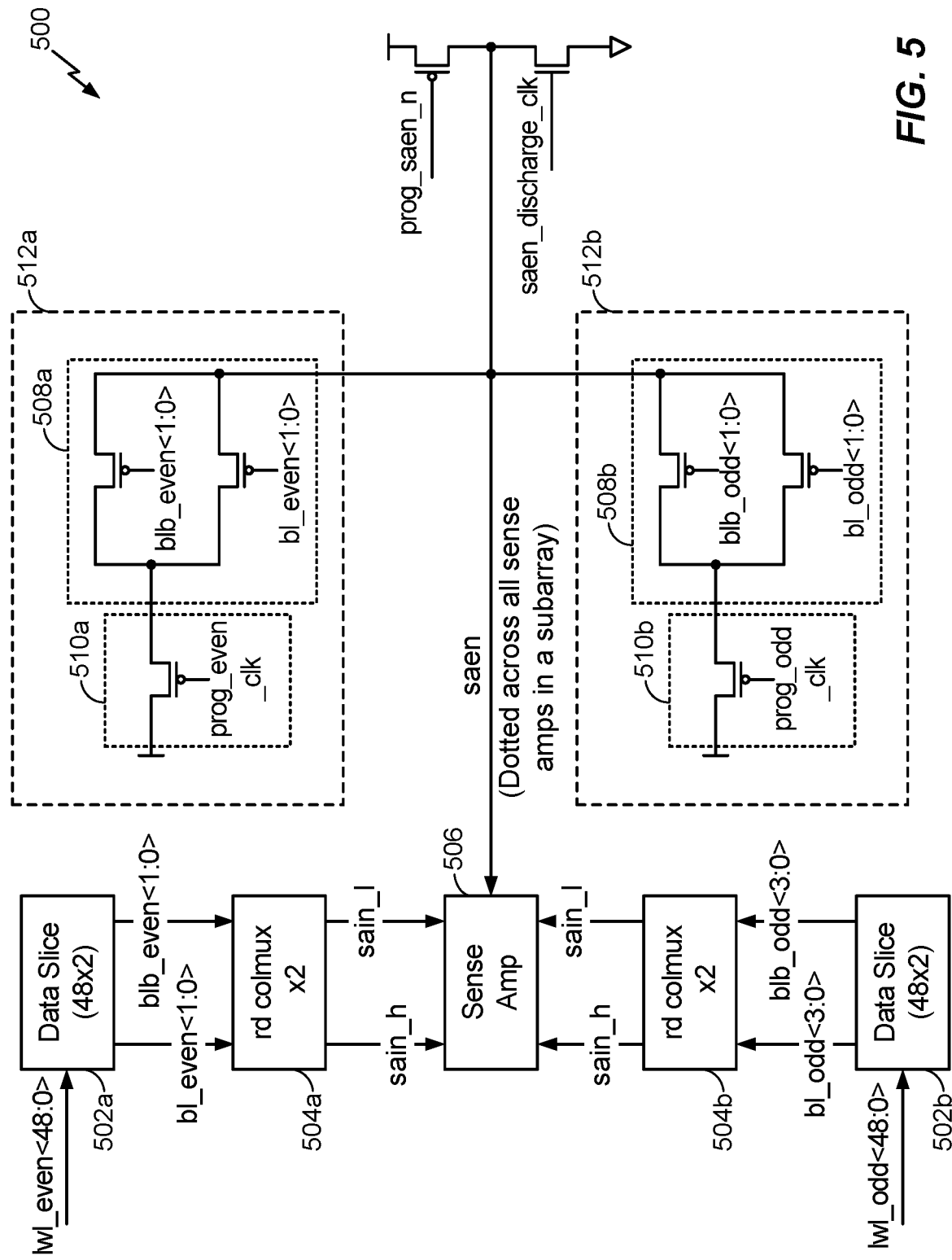
FIG. 5 illustrates an exemplary architecture showing the generation of the sense amplifier enable signal according to at least one aspect of the disclosure.

FIG. 5 illustrates an exemplary architecture 500 showing the generation of the self-timed sense amplifier enable signal according to at least one aspect of the disclosure. In the example of FIG. 5, the associated memory array (not shown, but which could correspond to, e.g., SRAM array 100) is a 96×64 array (96 rows and 64 columns). As illustrated in FIG. 5, an even 48×2 data slice 502a and an odd 48×2 data slice 502b are read from the memory array. Together, these two data slices (referred to as "half banks") represent two entire columns (two columns of 96 rows) of the memory array. However, as will be appreciated, this is merely an example configuration.

The two 48×2 data slices 502a and 502b (collectively referred to as data slices 502) are passed to corresponding multiplexors 504a and 504b (collectively referred to as multiplexors 504). The multiplexors 504 may be, for example, four-input two-output multiplexors (referred to as "rd colmux×2" multiplexors), taking as input the signals on four bitlines, specifically two pairs of bitlines (illustrated as "bl_even<1:0>", "blb_even<1:0>", "bl_odd<1:0>", and "blb_odd<1:0>," respectively), and outputting the signals "sain_h" and "sain_l," which represent the signals on the selected pair of bitlines. A sense amplifier 506 (which may correspond to the sense amplifier 302 in FIG. 3) receives the output signals "sain_h" and "sain_l" of the selected bitline pair from the multiplexors 504. Thus, rather than each column in the memory array being associated with its own sense amplifier, two columns (e.g., data slices 502) are associated with a single sense amplifier 506. The sense amplifier 506 also receives the sense amplifier enable ("saen") signal, the generation of which will be described below, in order to detect the voltage differential across the signals "sain_h" and "sain_l."

In the architecture 500, two additional pairs of transistors 508a and 508b (e.g., p-channel metal-oxide-semiconductor (PMOS) transistors) can be used to generate the sense amplifier enable signal based on the bitline discharge of each half bank (i.e., data slice 502). Whenever a pair of bitlines in a data slice 502 discharges, the discharge generates signals on the "bl" and "blb" bitlines (illustrated in FIG. 2). On the even half bank side (i.e., data slice 502a), the pair of transistors 508a receive "bl_even" and "blb_even" signals as inputs from the discharging pair of even bitlines, and on the odd side, the pair of transistors 508b receive "bl_odd" and "blb_odd" signals as inputs from the discharging pair of odd bitlines. These even and odd "bl" and "blb" signals, when input to the corresponding transistors 508a and 508b, generate the sense amplifier enable signal.

On the even half bank side (i.e., data slice 502a), a third transistor 510a is coupled to a "prog_even_clk" input that, when present, can be used to enable or disable the self-timed even sense amplifier enable signal generated by the pair of transistors 508a. Likewise, on the odd half bank side (i.e., data slice 502b), a third transistor 510b is coupled to a "prog_odd_clk" input that, when present, can be used to disable the self-timed odd sense amplifier enable signal generated by the pair of transistors 508b. The three transistors 508a/b (collectively transistors 508) and 510a/b (collectively transistors 510) coupled to each half bank are referred to herein as a "transistor stack" 512a/b (collectively transistor stacks 512). The strength of the third transistor 510 determines how fast the sense amplifier enable signal is generated in response to the discharge of the corresponding bl and blb bitlines. The strength of the transistor 510 can be adjusted to affect the sense amplifier margin. The strength can be adjusted by changing the effective size of the transistor 510 or by controlling its gate voltage when it is conducting during a read operation.

In the architecture 500, the outputs of the transistor stacks 512 are coupled together to form the sense amplifier enable signal "saen," which is input to each sense amplifier 506 across the various columns, or data slices 502, of the memory array. The joined output of the transistor stacks 512 can also be coupled to additional transistors/inputs. Specifically, a sense amplifier enable signal generated by conventional methods (illustrated as "prog_saen_n") can be multiplexed with the self-timed sense amplifier enable signal generated by the transistor stacks 512. Thus, the sense amplifier enable signal will be delayed during self-timed mode and arrive early when self-timed mode is disabled by the presence of prog_saen_n. Further, to bring the self-timed sense amplifier enable signal back down (i.e., to "reset" it), a "saen_discharge_clk" signal can be added to the architecture 500. This signal would have an inverse polarity to the wordline, and therefore becomes active after the wordline goes to "0." More specifically, this signal is an active LOW signal. Its rest value is HIGH and it goes LOW during a read operation where the wordline is HIGH.

Figure 6A:
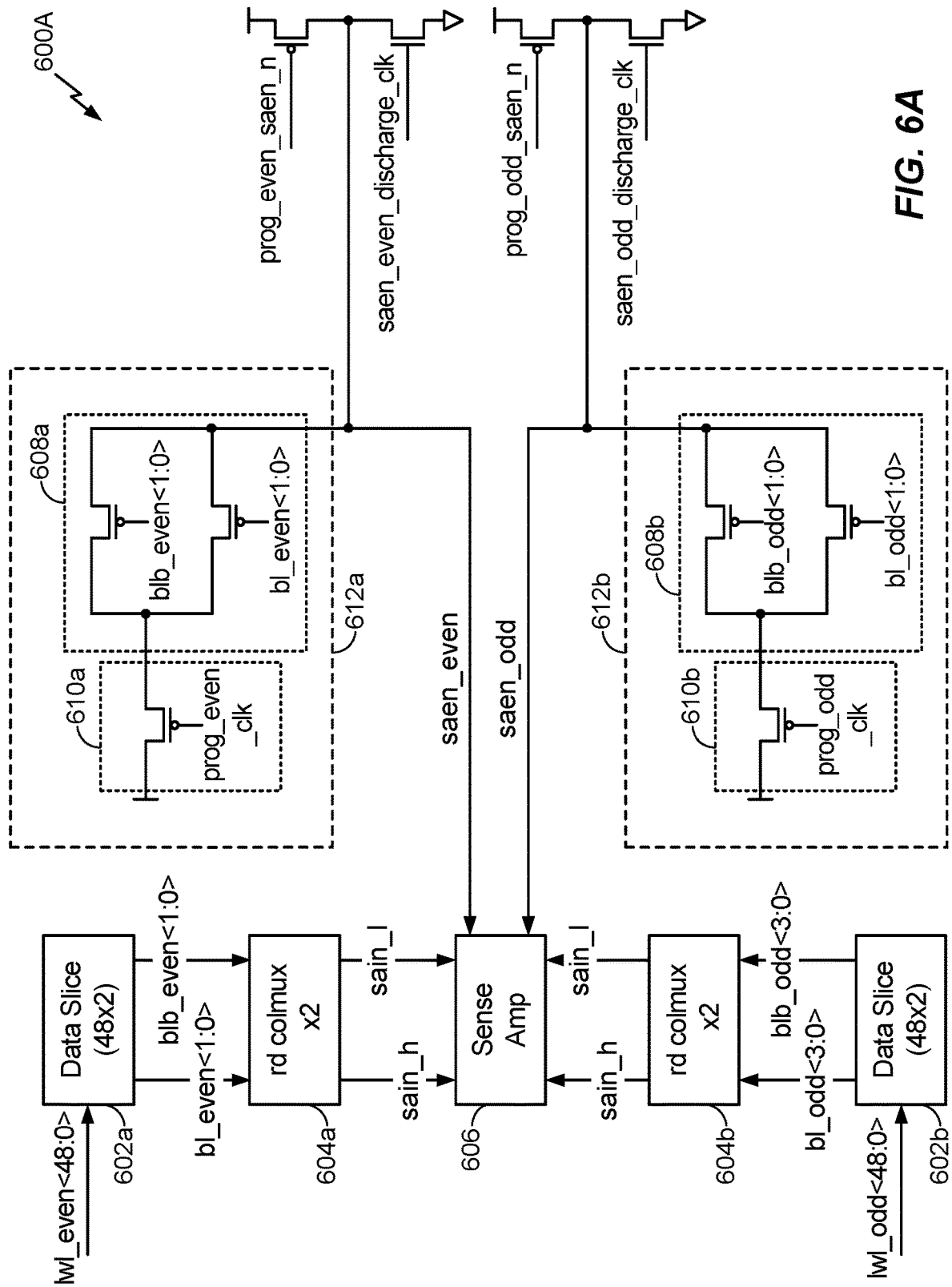
FIGS. 6A and 6B illustrate an exemplary system showing the generation of the sense amplifier enable signal according to at least one aspect of the disclosure.

FIG. 6A illustrates an exemplary architecture 600A showing the generation of a self-timed sense amplifier enable signal according to at least one aspect of the disclosure. The architecture 600A is a variation of the architecture 500 in FIG. 5. Like the architecture 500 in FIG. 5, the associated memory array (not shown, but which could correspond to, e.g., SRAM array 100) is a 96×64 array (96 rows and 64 columns). As illustrated in FIG. 6A, an even 48×2 data slice 602a and an odd 48×2 data slice 602b are read from the memory array. Together, these two data slices represent two entire columns of the memory array. However, as will be appreciated, this is merely an example configuration.

The two 48×2 data slices 602a and 602b (collectively referred to as data slices 602) are passed to corresponding multiplexors 604a and 604b (collectively referred to as multiplexors 504). As in FIG. 5, the multiplexors 604 may be, for example, four-input two-output multiplexors (referred to as "rd colmux×2" multiplexors), taking as input the signals on four bitlines, specifically two pairs of bitlines (illustrated as "bl_even<1:0>", "blb_even<1:0>", "bl_odd <1:0>", and "blb_odd<1:0>," respectively), and outputting the signals "sain_h" and "sain_l," which represent the signals on the selected pair of bitlines. A sense amplifier 606 (which may correspond to the sense amplifier 702 in FIG. 7) receives the output signals "sain_h" and "sain_l" of the selected bitline pair from the multiplexors 604 and the sense amplifier enable signals ("saen_even" and "saen_odd"), the generation of which will be described below, in order to detect the voltage differential across the signals "sain_h" and "sain_l."

Like the architecture 500, two additional pairs of transistors 608a and 608b (e.g., PMOS transistors) can be used to generate the sense amplifier enable signals based on the bitline discharge of each half bank (i.e., data slice 602). On the even half bank side (i.e., data slice 602a), the pair of transistors 608a receive "bl_even" and "blb_even" signals as inputs from the discharging pair of even bitlines, and on the odd side, the pair of transistors 608b receive "bl_odd" and "blb_odd" signals as inputs from the discharging pair of odd bitlines. These even and odd "bl" and "blb" signals, when input to the corresponding pairs of transistors 608a and 608b, generate the sense amplifier enable signals "saen_even" and "saen_odd," respectively On the even half bank side (i.e., data slice 602a), a third transistor 610a is coupled to a "prog_even_clk" input that, when present, can be used to disable the self-timed even sense amplifier enable signal generated by the pair of transistors 608a. Likewise, on the odd half bank side (i.e., data slice 602b), a third transistor 610b is coupled to a "prog_odd_clk" input that, when present, can be used to disable the self-timed odd sense amplifier enable signal generated by the pair of transistors 608b. The three transistors 608a/b (collectively transistors 608) and 610a/b (collectively transistors 610) coupled to each half bank are referred to herein as a "transistor stack" 612a/b (collectively transistor stacks 612).

In the architecture 600A, unlike the architecture 500, a read can be performed in one of data slices 602a and 602b of the memory array, and a write operation can be performed in the other of data slice 602a and 602b of the memory array. Thus, in the architecture 600A, the output of the transistor stack 612a forms the sense amplifier enable signal "saen_even," which is input to each sense amplifier 606 across the various columns of the memory array, and the output of the transistor stack 612b forms the sense amplifier enable signal "saen_odd," which is also input to each sense amplifier 606 across the various columns of the memory array.

Because of the even and odd sense amplifier enable signals, there is a need for separate "prog_even_saen_n" and "prog_odd_saen_n" signals and separate "saen_even_discharge_clk" and "saen_odd_discharge_clk" signals, instead of the single "prog_saen_n" and "saen_discharge_clk" signals in architecture 500. Specifically, even and odd sense amplifier enable signals generated by conventional methods (illustrated as "prog_even_saen_n" and "prog_odd_saen_n") can be multiplexed with the even and odd self-timed sense amplifier enable signals generated by the transistor stacks 612. Thus, the even and odd sense amplifier enable signals will be delayed during self-timed mode and arrive early when self-timed mode is disabled by the presence of prog_even_saen_n and prog_odd_saen_n. Further, to reset the self-timed even and odd sense amplifier enable signals, "saen_even_discharge_clk" and "saen_odd_discharge_clk" signals can be added to the architecture 600A. These signals would have an inverse polarity to the respective wordlines, and therefore become active after the wordlines go to "0."

Figure 6B:
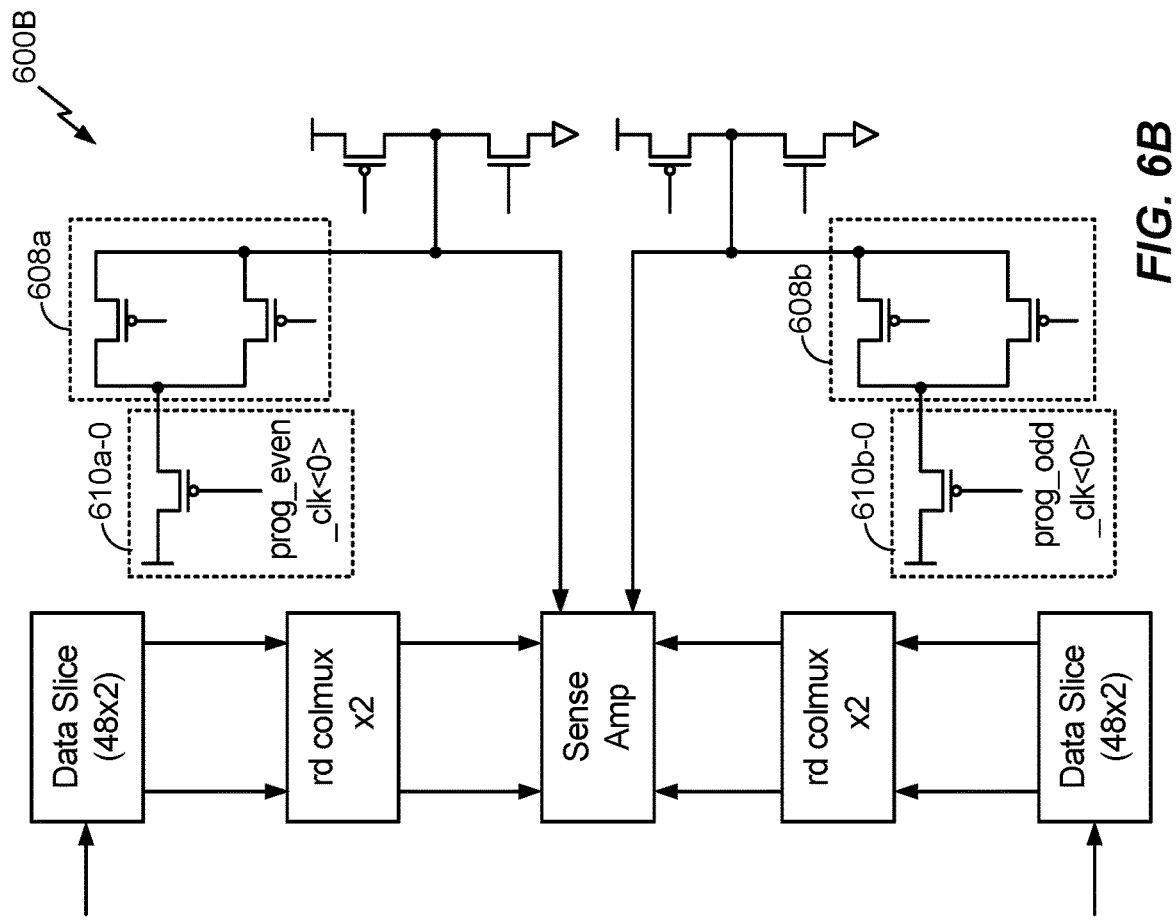
Figure 6B:
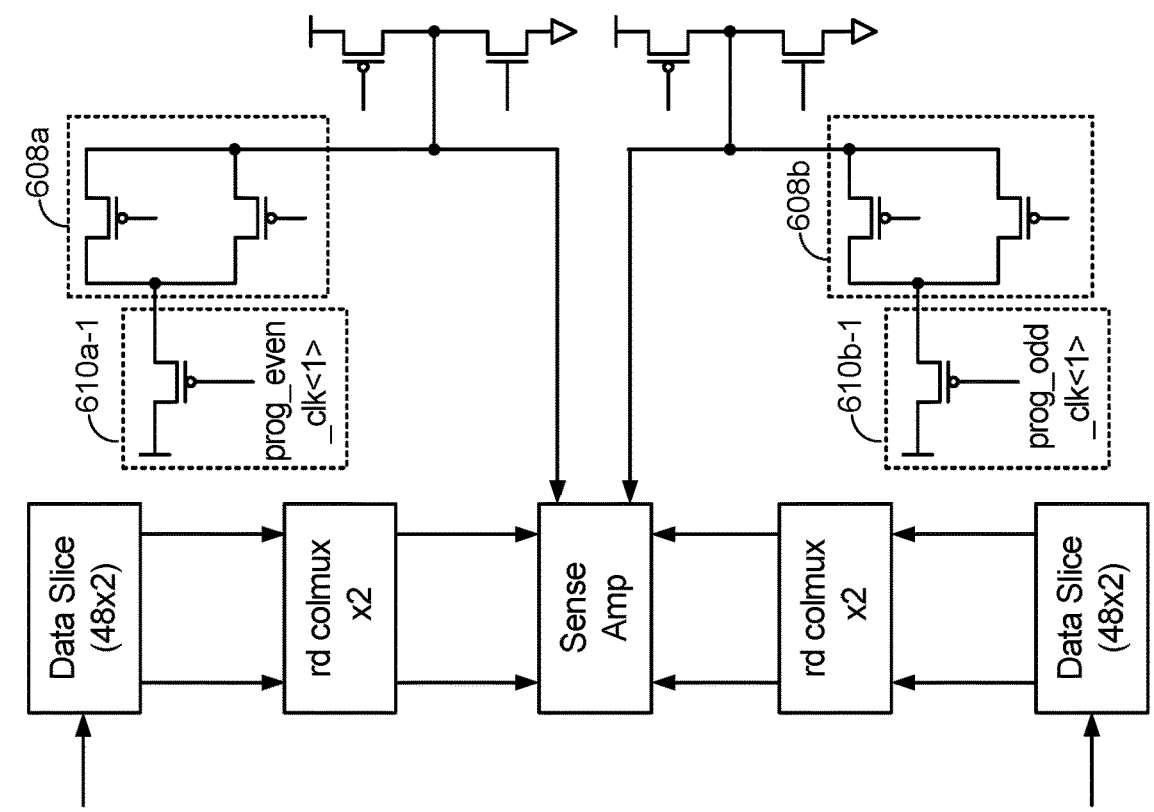

FIG. 6B illustrates an exemplary architecture 600B showing the generation of a self-timed sense amplifier enable signal according to at least one aspect of the disclosure. The architecture 600B is a variation of the architecture 600A in FIG. 6A. In the architecture 600B, the program clock transistors (the even program clock transistors 610a-0 and 610a-1 coupled to the "prog_even_clk<0>" and "prog_even_clk<1>" inputs, respectively, and the odd program clock transistors 610b-0 and 610b-1 coupled to the "prog_odd_clk<0>" and "prog_odd_clk<1>" inputs, respectively) are configured to disable the common output (either "saen_even" or "saen_odd") of the bl transistor and the blb transistor (either the pair of transistors 608a or the pair of transistors 608b) based on enabling a subset of program clock transistors. More specifically, FIG. 6B illustrates two representative columns, where the transistor headers in different columns are driven by different signals. For example, the transistor headers in the two columns for the even sub-bank are driven by "prog_even_clk<1>" and "prog_even_clk<0>." Similarly, the transistor headers in the two columns for the odd sub-bank are driven by "prog_odd_clk<1>" and "prog_odd_clk<0>." This way, a subset of the program clock transistors 610a-0, 610a-1, 610b-0, and 610b-1 can be enabled.

Figure 7:
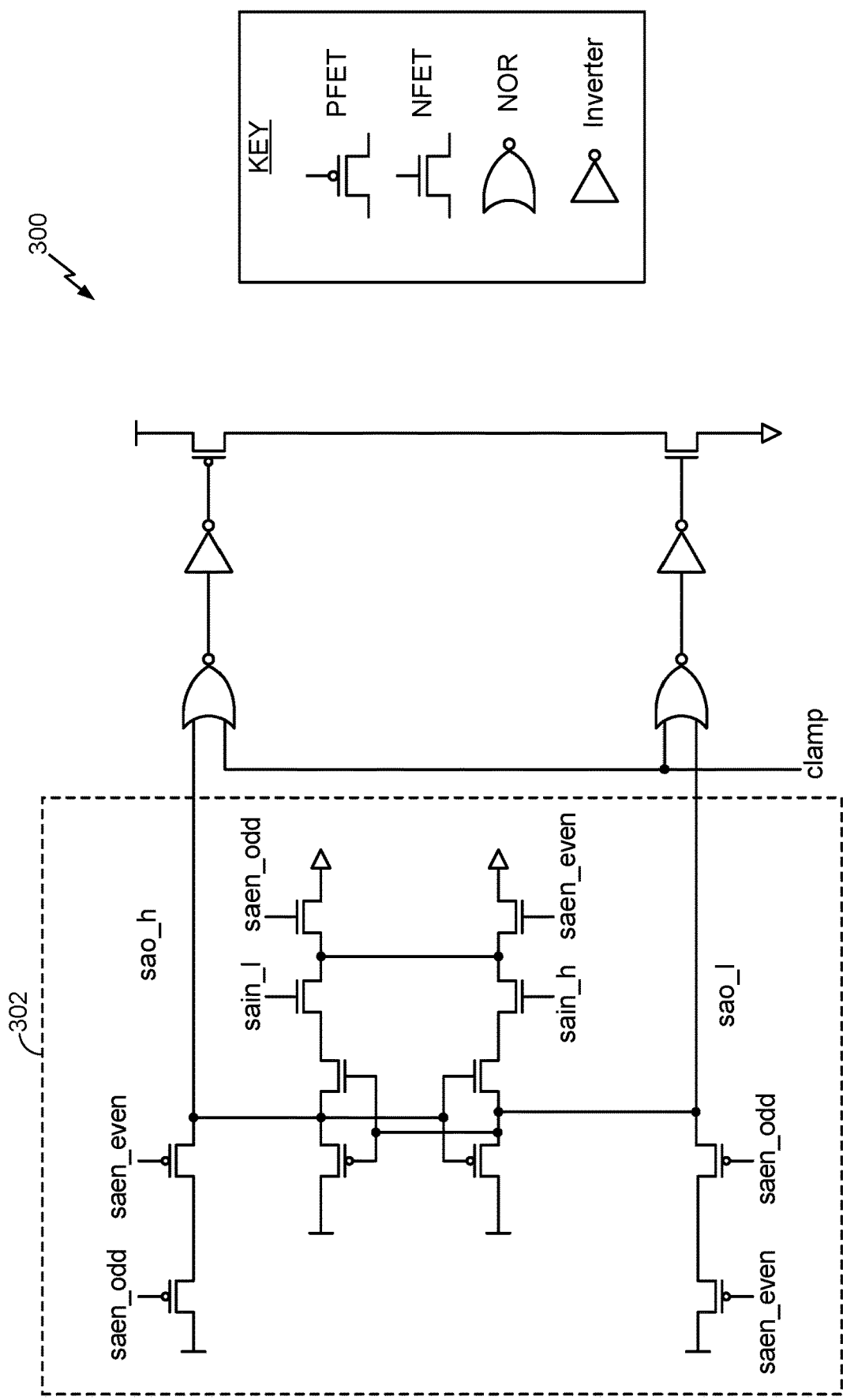
FIG. 7 illustrates an exemplary circuit including a sense amplifier according to an aspect of the disclosure.

FIG. 7 illustrates an exemplary circuit 700 including a sense amplifier 702 according to an aspect of the disclosure. The sense amplifier 702 may correspond to the sense amplifier 606 in FIG. 6A capable of receiving two sense amplifier enable signals. The sense amplifier 702 is similar to the sense amplifier 302 in FIG. 3, but includes two additional transistors to receive a second sense amplifier enable signal. Specifically, the sense amplifier 702 includes a first pair of PFETs (illustrated at the top left side and the bottom left side of the sense amplifier 702) that receive the even sense amplifier enable signal ("saen_even"), and a second pair of PFETs (also at the top left side and the bottom left side of the sense amplifier 702) that receive the odd sense amplifier enable signal ("saen_odd,").

These two signals are mutually exclusive: one of them goes active depending on whether the even or odd half bank array columns (e.g., data slices 602) are being read. More specifically, before a read operation, the "saen_even" (or "saen_odd") signal is LOW, causing sense amplifier outputs to be in a precharged state. When even (or odd) columns are read, the "saen_even" (or "saen_odd") goes HIGH, which allows the sense amplifier 702 to sense the voltage difference between "sain_l" and "sain_r" (the outputs of the column multiplexor (e.g., column multiplexor 114) feeding into the sense amplifier 702) and to capture and output it as a full swing from 1 to 0 (or vice versa). Since the precharge transistors (i.e., the four PFETs feeding the output signals "sao_h" and "sao_l") have to cut off from the output signals when either sense amplifier enable signal goes HIGH, each output signal "sao_h" and "sao_l" is connected to two such PFETs in series, each connected to one (an even or odd) sense amplifier enable signal.

Figure 8:
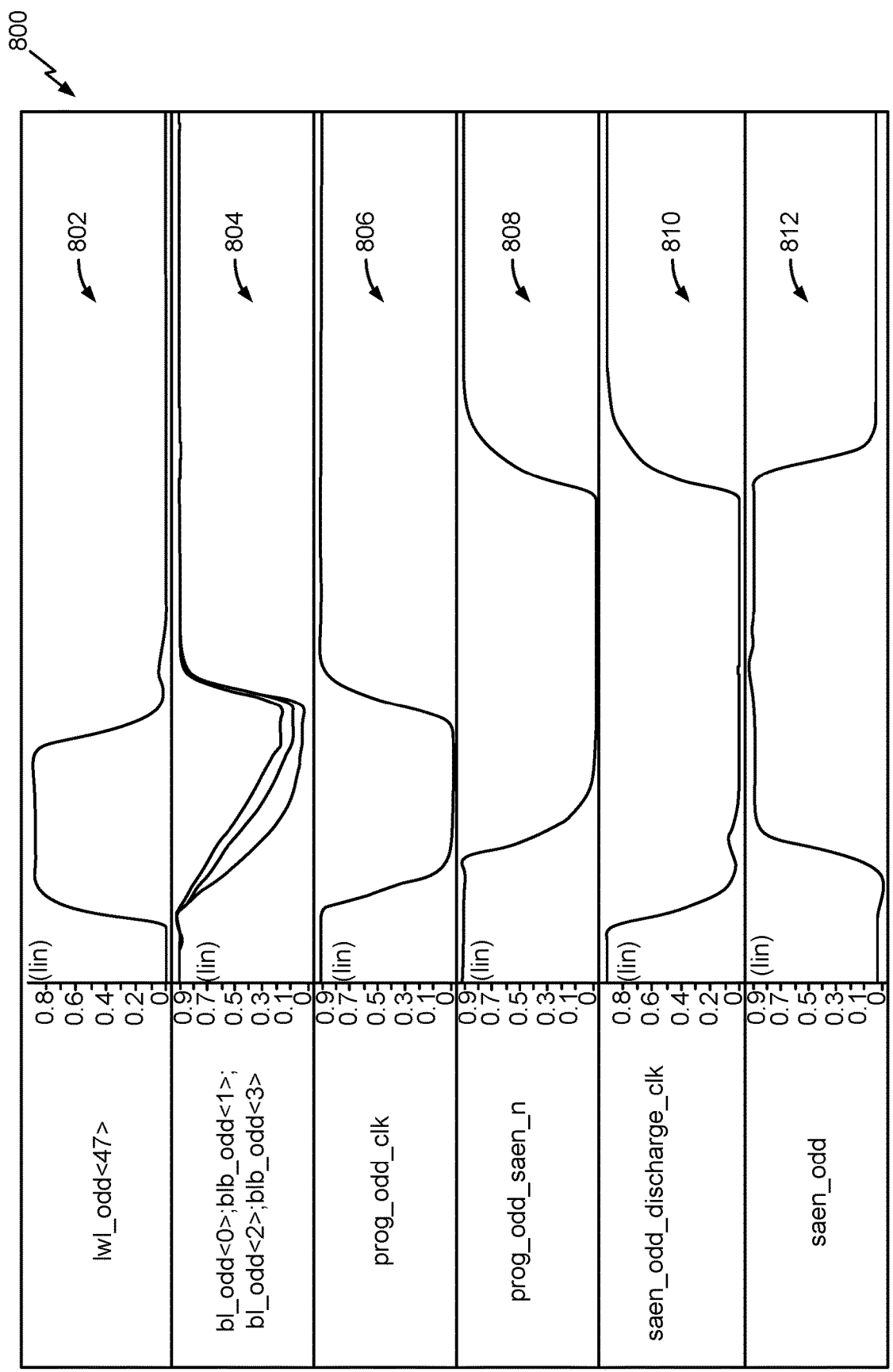
FIG. 8 shows various graphs illustrating the timing of various signals according to at least one aspect of the disclosure.

FIG. 8 is a graph 800 illustrating the timing of various signals according to at least one aspect of the disclosure. As illustrated in FIG. 8, the signals are part of a read operation. The first row 802 shows the local wordline, "lwl_odd<47>," going HIGH, indicating an active wordline. The second row 804 shows the bitlines discharging at different speeds. The third row 806 shows the "prog_odd_clk" going LOW, enabling the PFET stack (e.g., transistor stack 512a in FIG. 5) to drive the sense amplifier enable signal "saen_odd." The fourth row 808 indicates the "prog_odd_saen_n," which is the programmable sense amplifier enable signal that can be multiplexed with the output of the PFET stack. The fifth row 810 represents the "saen_odd_discharge_clk," which resets the "saen_odd." The sixth row 812 shows the "saen_odd" signal, which feeds the input of the sense amplifier.

Existing approaches to generating the sense amplifier enable signal use logic gates such as inverters, NAND gates, NOR gates, and the like. The process variation of regular logic gates is different from 6T SRAM bitcells. Since the proposed solution uses the SRAM bitcell delay to generate the sense amplifier enable signal, it tracks much better process corners compared with existing approaches.

Figure 9:
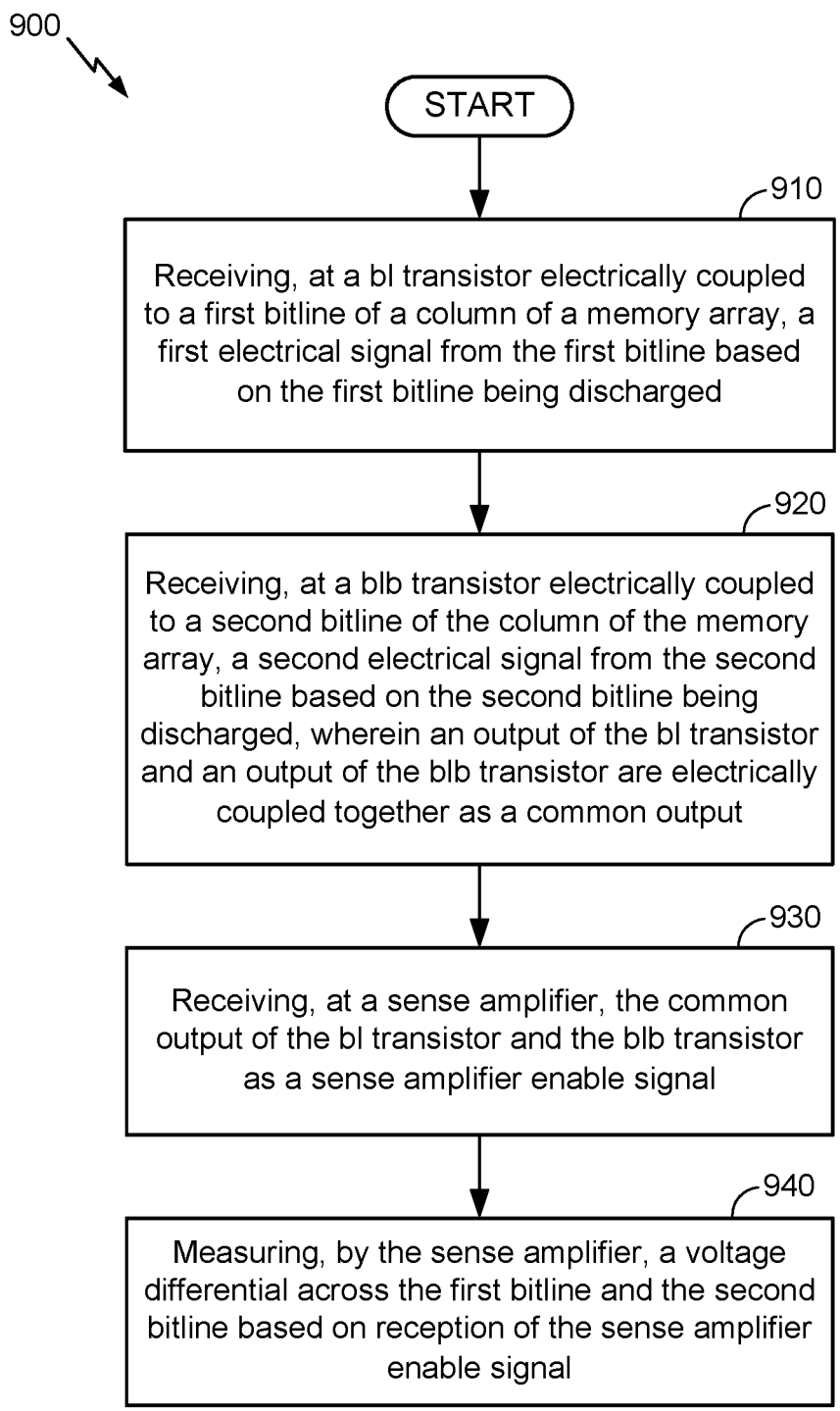
FIG. 9 illustrates an exemplary method of operating a memory system according to an aspect of the disclosure.

FIG. 9 illustrates an exemplary method 900 of operating a memory system according to an aspect of the disclosure. At 910, the method 900 includes receiving, at a bl transistor (e.g., the bl transistor of the pair of transistors 508) electrically coupled to a first bitline (e.g., bitline 106a in FIG. 2) associated with a column (e.g., column 200 in FIG. 2) of a memory array (e.g., SRAM array 100), a first electrical signal from the first bitline based on the first bitline being discharged. At 920, the method 900 includes receiving, at a blb transistor (e.g., the blb transistor of the pair of transistors 508) electrically coupled to a second bitline (e.g., bitline 106b in FIG. 2) associated with the column of the memory array, a second electrical signal from the second bitline based on the second bitline being discharged. In an aspect, an output of the bl transistor and an output of the blb transistor are combined into a common output (e.g., the common output of the pair of transistors 508). At 930, the method 900 includes receiving, at a sense amplifier (e.g., sense amplifier 506 of FIG. 5) electrically coupled to the first bitline and the second bitline, the common output of the bl transistor and the blb transistor as a sense amplifier enable signal. At 940, the method 900 includes measuring, by the sense amplifier, a voltage differential across the first bitline and the second bitline based on reception of the sense amplifier enable signal.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements. In addition, terminology of the form "at least one of A, B, or C" or "one or more of A, B, or C" or "at least one of the group consisting of A, B, and C" used in the description or the claims means "A or B or C or any combination of these elements." For example, this terminology may include A, or B, or C, or A and B, or A and C, or A and B and C, or 2A, or 2B, or 2C, and so on.

In view of the descriptions and explanations above, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Accordingly, it will be appreciated, for example, that an apparatus or any component of an apparatus may be configured to (or made operable to or adapted to) provide functionality as taught herein. This may be achieved, for example: by manufacturing (e.g., fabricating) the apparatus or component so that it will provide the functionality; by programming the apparatus or component so that it will provide the functionality; or through the use of some other suitable implementation technique. As one example, an integrated circuit may be fabricated to provide the requisite functionality. As another example, an integrated circuit may be fabricated to support the requisite functionality and then configured (e.g., via programming) to provide the requisite functionality. As yet another example, a processor circuit may execute code to provide the requisite functionality.

While the foregoing disclosure shows various illustrative aspects, it should be noted that various changes and modifications may be made to the illustrated examples without departing from the scope defined by the appended claims. The present disclosure is not intended to be limited to the specifically illustrated examples alone. For example, unless otherwise noted, the functions, steps, and/or actions of the method claims in accordance with the aspects of the disclosure described herein need not be performed in any particular order. Furthermore, although certain aspects may be described or claimed in the singular, the plural is contemplated unless limitation to the singular is explicitly stated.

What is claimed is:

1. A memory system comprising:
a sense amplifier configured to amplify a voltage swing, the sense amplifier electrically coupled to a first bitline and a second bitline associated with a column of a memory array;
a bl transistor electrically coupled to the first bitline, wherein the bl transistor is configured to receive as input a first electrical signal from the first bitline based on the first bitline being discharged; and
a blb transistor electrically coupled to the second bitline, wherein the blb transistor is configured to receive as input a second electrical signal from the second bitline based on the second bitline being discharged, wherein an output of the bl transistor and an output of the blb transistor are electrically coupled together as a common output,
wherein the sense amplifier is configured to receive as an input the common output of the bl transistor and the blb transistor as a sense amplifier enable signal, and wherein the sense amplifier is further configured to measure a voltage differential across the first bitline and the second bitline based on reception of the sense amplifier enable signal.

2. The memory system of claim 1, wherein the memory array comprises a static random-access memory (SRAM) array.

3. The memory system of claim 1, wherein the bl transistor is configured to conduct electricity when the first bitline is discharged, and wherein the blb transistor is configured to be powered when the second bitline is discharged.

4. The memory system of claim 1, wherein the common output of the bl transistor and the blb transistor are connected across two or more columns in the memory array configured to be accessed together.

5. The memory system of claim 1, further comprising a multiplexor electrically coupled between a plurality of bitlines and the sense amplifier, the plurality of bitlines including the first bitline and the second bitline, the multiplexor configured to select a pair of bitlines of the plurality of bitlines and to output the pair of bitlines to the sense amplifier.

6. The memory system of claim 1, further comprising a program clock transistor electrically coupled to the bl transistor and the blb transistor, wherein the program clock transistor is configured to disable the common output of the bl transistor and the blb transistor.

7. The memory system of claim 6, wherein a size of the program clock transistor determines a strength of the program clock transistor.

8. The memory system of claim 6, wherein a gate voltage of the program clock transistor determines a strength of the program clock transistor when it is conducting electricity during a read operation.

9. The memory system of claim 6, wherein the program clock transistor is configured to disable the common output of the bl transistor and the blb transistor based on enabling a subset of program clock transistors.

10. The memory system of claim 1, further comprising a multiplexor configured to select an input from a program sense amplifier enable signal transistor or the common output of the bl transistor and the blb transistor.

11. The memory system of claim 1, further comprising a discharge transistor configured to disable the common output of the bl transistor and the blb transistor.

12. The memory system of claim 1, further comprising:
a plurality of columns of the memory array including the column, wherein less than all of the plurality of columns are associated with a plurality of pairs of bl transistors and blb transistors including the bl transistor and the blb transistor.

13. A method of operating a memory system comprising:
receiving, at a bl transistor electrically coupled to a first bitline of a column of a memory array, a first electrical signal from the first bitline based on the first bitline being discharged;
receiving, at a blb transistor electrically coupled to a second bitline of the column of the memory array, a second electrical signal from the second bitline based on the second bitline being discharged, wherein an output of the bl transistor and an output of the blb transistor are electrically coupled together as a common output;
receiving, at a sense amplifier configured to amplify a voltage swing, the common output of the bl transistor and the blb transistor as a sense amplifier enable signal, wherein the sense amplifier is electrically coupled to the first bitline and the second bitline; and
measuring, by the sense amplifier, a voltage differential across the first bitline and the second bitline based on reception of the sense amplifier enable signal.

14. The method of claim 13, wherein the memory array comprises a static random-access memory (SRAM) array.

15. The method of claim 13, wherein the bl transistor is conducting electricity when the first bitline is discharged, and wherein the blb transistor is powered when the second bitline is discharged.

16. The method of claim 13, wherein the common output of the bl transistor and the blb transistor are connected across two or more columns in the memory array that are accessed together.

17. The method of claim 13, further comprising:
selecting, by a multiplexor electrically coupled between a plurality of bitlines and the sense amplifier, the plurality of bitlines including the first bitline and the second bitline, a pair of bitlines of the plurality of bitlines; and
outputting, by the multiplexor, the pair of bitlines to the sense amplifier.

18. The method of claim 13, further comprising:
disabling, by a program clock transistor electrically coupled to the bl transistor and the blb transistor, the common output of the bl transistor and the blb transistor.

19. The method of claim 18, wherein a size of the program clock transistor determines a strength of the program clock transistor.

20. The method of claim 18, wherein a gate voltage of the program clock transistor determines a strength of the program clock transistor when it is conducting electricity during a read operation.

21. The method of claim 18, wherein the program clock transistor is configured to disable the common output of the bl transistor and the blb transistor based on enabling a subset of program clock transistors.

22. The method of claim 13, further comprising:
selecting, by a multiplexor, an input from a program sense amplifier enable signal transistor or the common output of the bl transistor and the blb transistor.

23. The method of claim 13, further comprising:
disabling, by a discharge transistor, the common output of the bl transistor and the blb transistor.

24. The memory system of claim 13, wherein the memory array comprises a plurality of columns, including the column, wherein less than all of the plurality of columns are associated with a plurality of pairs of bl transistors and blb transistors, including the bl transistor and the blb transistor.

25. A memory system comprising:
first means for receiving a first electrical signal from a first bitline of a column of a memory array based on the first bitline being discharged, the first means for receiving electrically coupled to the first bitline;
second means for receiving a second electrical signal from a second bitline of the column of the memory array based on the second bitline being discharged, the second means for receiving electrically coupled to the second bitline, wherein an output of the first means for receiving and an output of the second means for receiving are electrically coupled together as a common output; and
means for amplifying a voltage swing configured to receive the common output of the first means for receiving and the second means for receiving as a sense amplifier enable signal, the means for amplifying the voltage swing electrically coupled to the first bitline and the second bitline, wherein the means for amplifying the voltage swing is further configured to measure a voltage differential across the first bitline and the second bitline based on reception of the sense amplifier enable signal.

26. The memory system of claim 25, further comprising:
means for selecting and outputting a pair of bitlines of a plurality of bitlines of the memory array, the plurality of bitlines including the first bitline and the second bitline, the means for selecting coupled between the plurality of bitlines and the means for amplifying the voltage swing.

27. The memory system of claim 25, further comprising:
means for disabling the common output of the first means for receiving and the second means for receiving, the means for disabling electrically coupled to the first means for receiving and the second means for receiving.

28. The memory system of claim 25, further comprising:
means for selecting an input from a program sense amplifier enable signal transistor or the common output of the first means for receiving and the second means for receiving.

* * * * *